United States Patent
Yang et al.

[11] Patent Number: 5,924,001
[45] Date of Patent: Jul. 13, 1999

[54] ION IMPLANTATION FOR PREVENTING POLYCIDE VOID

[75] Inventors: Chie-Ming Yang; Jih-Wha Wang, both of Hsin-Chu; Chien-Jiun Wang, Yung-Ho; Bou Fun Chen; Liang Szuma, both of Taipei, all of Taiwan

[73] Assignee: Taiwan Semiconductor Manufacturing Company, Ltd., Hsin-Chu, Taiwan

[21] Appl. No.: 09/004,188

[22] Filed: Jan. 8, 1998

[51] Int. Cl.⁶ .................................................. H01L 21/283
[52] U.S. Cl. ......................... 438/592; 438/659; 257/340
[58] Field of Search ................................. 438/305, 162, 438/585, 210, 659, 660, 798, 412, 592; 257/370, 913, 384, 386, 388

[56] References Cited

U.S. PATENT DOCUMENTS

| | | | |
|---|---|---|---|
| 4,680,614 | 7/1987 | Beyer et al. | 438/513 |
| 4,777,150 | 10/1988 | Deneuville et al. | 438/659 |
| 5,010,024 | 4/1991 | Allen et al. | 438/659 |
| 5,296,407 | 3/1994 | Eguchi | 438/629 |
| 5,444,024 | 8/1995 | Anjum et al. | 437/200 |
| 5,541,131 | 7/1996 | Yoo et al. | |
| 5,624,869 | 4/1997 | Agnello et al. | 438/602 |
| 5,654,241 | 8/1997 | Kakumu | 438/306 |
| 5,798,296 | 8/1998 | Fazan et al. | 438/592 |

OTHER PUBLICATIONS

"Oxidation Phenomena of Polysilicon/Tungsten Silicide Structures" by N. Hsieh, Journal of the Electrochemical Soc. Jan. 1984, pp. 201–205.

"Controlling Void Formation in $WSi_2$ Polycides", by C.W. Koburger et al. IEEE Electron Device Letters, vol. EDL–5, No. 5, May 1984, pp. 166–168.

*Primary Examiner*—Olik Chaudhuri
*Assistant Examiner*—William David Coleman
*Attorney, Agent, or Firm*—George O. Saile; Stephen B. Ackerman; Rosemary L.S. Pike

[57] ABSTRACT

A method for fabricating polycide gate electrodes wherein voids at the silicide/polysilicon interface are eliminated by ion implantation is described. A layer of gate silicon oxide is grown over the surface of a semiconductor substrate. A polysilicon layer is deposited overlying the gate silicon oxide layer. A silicide layer is formed overlying the polysilicon layer. Silicon ions are implanted into the silicide layer. A hard mask layer is deposited over the silicide layer. Because of the presence of the silicon ions in the silicide layer, silicon atoms from the polysilicon layer do not diffuse into the silicide layer causing voids to form in the polysilicon layer. Therefore, the formation of silicon pits in the semiconductor substrate is prevented. The silicide, polysilicon and gate silicon oxide layers are patterned to complete fabrication of a gate electrode in the manufacture of an integrated circuit device.

20 Claims, 4 Drawing Sheets

ION IMPLANTATION FOR PREVENTING POLYCIDE VOID

RELATED PATENT APPLICATION

U.S. patent application Ser. No. 004,190 filed Jan. 8, 1998, to C. M. Yang et al.

BACKGROUND OF THE INVENTION (1) Field of the Invention

The invention relates to the fabrication of integrated circuit devices, and more particularly, to a method of preventing silicon pits in the active region in the fabrication of integrated circuits.

(2) Description of the Prior Art

As device sizes shrink into the sub-micron and sub-half-micron regime, it has become necessary to use a combination of polysilicon and refractory metal silicides as the material for gate electrodes and interconnection lines because of their reduced resistivity. It is also essential to keep the active regions as free from defects as possible. Pitting of the silicon in the active areas can cause junction leakage and low yields. FIG. 1 illustrates a partially completed integrated circuit device in which voids 20 form at the interface between a polysilicon layer 16 and a silicide layer 18 after deposition of a tetraethoxysilane (TEOS) layer 19. When the polysilicon and silicide layers are patterned to form a gate electrode, as illustrated in FIG. 2, pits 22 are formed in the silicon where the voids were located.

The paper, "Oxidation Phenomena of Polysilicon/Tungsten Silicide Structures," by N. Hsieh, *Journal of the Electrochemical Society*, January 1984, pp. 201–205, discusses the formation of voids in a polysilicon layer under a silicide layer. The voids form as a result of pinholes in the native oxide layer between the polysilicon and the silicide layers. In the paper, "Controlling Void Formation in WSi$_2$ Polycides," by C. W. Koburger et al, *IEEE Electron Device Letters*, Vol. EDL-5, No. 5, May 1984, pp. 166–168, the authors also discuss void formation in the polysilicon layer under a silicide layer. They prevent the formation of these voids by depositing a capping layer of polysilicon over the silicide prior to oxidation.

Workers in the art have used ion implantation in the manufacture of integrated circuit devices. U.S. Pat. No. 5,541,131 to Yoo et al implants silicon ions into the top surface of the silicide layer of a polycide gate electrode as a silicon source during oxidation or annealing to prevent stress and thus to prevent peeling of the silicide layer. U.S. Pat. No. 5,624,869 to Agnello et al implants platinum or nitrogen ions into a cobalt silicide layer to preserve the structure under thermal stress. U.S. Pat. No. 5,444,024 to Anjum et al implants argon ions into a silicide layer to prevent underlying silicon from diffusing into the silicide. U.S. Pat. No. 5,654,241 to Kakumu implants metal ions into silicon and then heat-treats the silicon to form a silicide. None of these workers describe a solution to the silicon pitting problem described above.

SUMMARY OF THE INVENTION

A principal object of the present invention is to provide an effective and very manufacturable method of fabricating polycide gate electrodes in the fabrication of integrated circuit devices.

A further object of the invention is to provide a method of fabricating polycide gates wherein silicon pits in the active region are avoided.

Yet another object of the invention is to provide a method of fabricating polycide gate electrodes wherein voids at the silicide/polysilicon interface are eliminated.

Yet another object is to provide a method of fabricating polycide gate electrodes wherein silicon pits in the active region are avoided by eliminating voids at the silicide/polysilicon interface.

A still further object of the invention is to provide a method of fabricating polycide gate electrodes wherein voids at the silicide/polysilicon interface are eliminated by ion implantation.

Yet another object of the invention is to provide a method of fabricating polycide gate electrodes wherein silicon pits in the active region are avoided by implanting silicon ions to eliminate voids at the silicide/polysilicon interface.

In accordance with the objects of this invention a method for fabricating polycide gate electrodes wherein voids at the silicide/polysilicon interface are eliminated by ion implantation is achieved. A layer of gate silicon oxide is grown over the surface of a semiconductor substrate. A polysilicon layer is deposited overlying the gate silicon oxide layer. A silicide layer is formed overlying the polysilicon layer. Silicon ions are implanted into the silicide layer. A hard mask layer is deposited over the silicide layer. Because of the presence of the silicon ions in the silicide layer, silicon atoms from the polysilicon layer do not diffuse into the silicide layer causing voids to form in the polysilicon layer. Therefore, the formation of silicon pits in the semiconductor substrate is prevented. The silicide, polysilicon and gate silicon oxide layers are patterned to complete fabrication of a gate electrode in the manufacture of an integrated circuit device.

BRIEF DESCRIPTION OF THE DRAWINGS

In the accompanying drawings forming material part of this description, there is shown.

DESCRIPTION OF THE PREFERRED EMBODIMENTS

FIGS. 1–7 illustrate an N-channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 3:
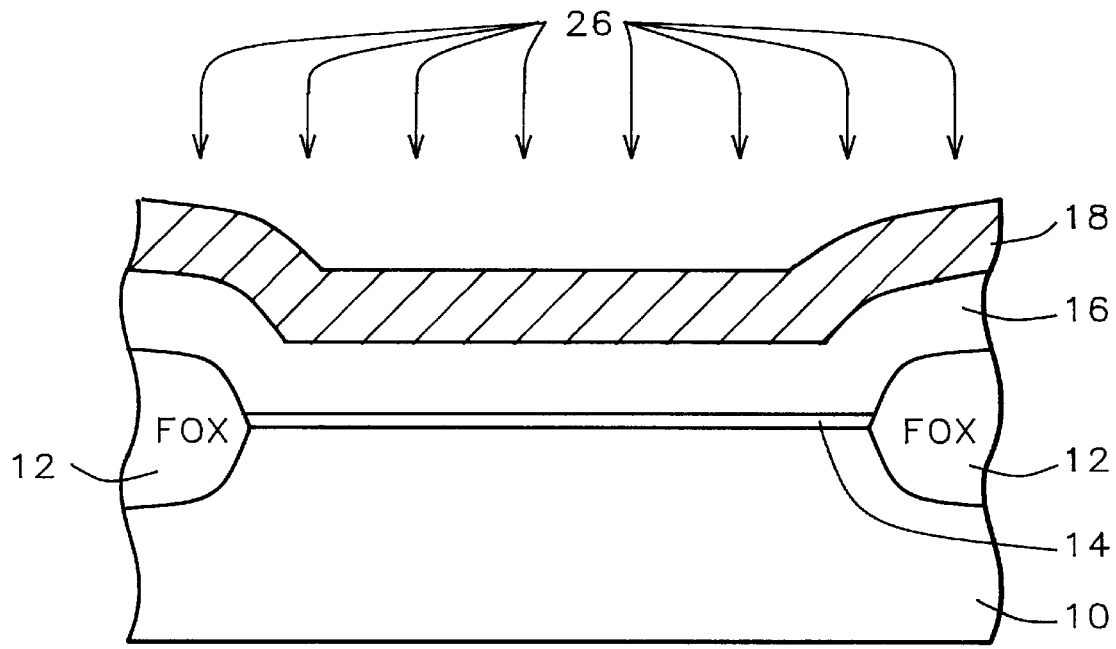
FIGS. 3 through 7 schematically illustrate in cross-sectional representation a preferred embodiment of the present invention.
Figure 4:
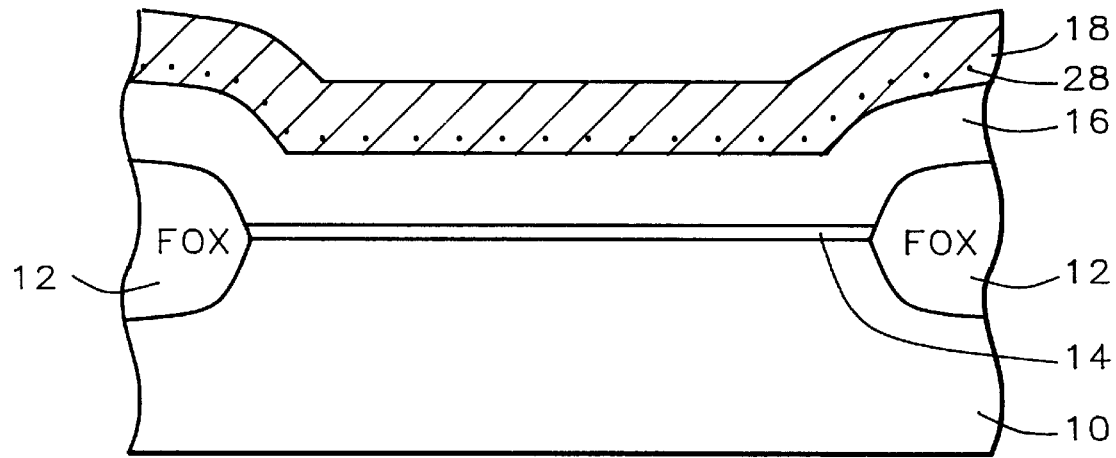

Referring now more particularly to FIG. 3, there is shown an illustration of a partially completed metal oxide field effect transistor (MOSFET) integrated circuit device. The semiconductor substrate 10 is preferably composed of silicon having a (100) crystallographic orientation. In an effort to simplify the description and the drawings, the dielectric isolation between devices has been only partially shown and will not be described in detail, because they are conventional. For example, Field OXide regions 12 are formed in the semiconductor substrate to separate active areas. Then semiconductor devices can be provided in the silicon mesas according to the following processes.

The surface of the silicon substrate 10 is thermally oxidized to form the desired gate oxide layer 14. The preferred thickness is between about 50 to 100 Angstroms.

Polysilicon layer 16 is deposited by low pressure chemical vapor deposition (LPCVD) to a thickness of between about 500 and 1500 Angstroms. Then a layer of tungsten silicide 18 is deposited by chemical vapor deposition to a thickness of between about 1000 and 1500 Angstroms. Alternatively, another silicide such as titanium silicide could be used.

Figure 1:
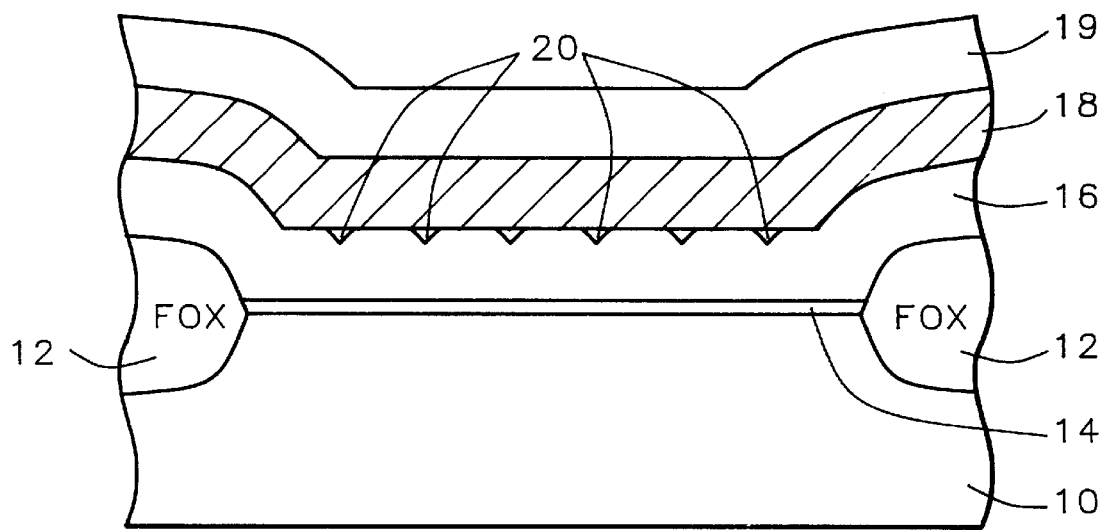
FIGS. 1 and 2 schematically illustrate in cross-sectional representation the silicon pitting problem of the prior art.

A hard mask, such as TEOS, is deposited over the silicide layer to prevent shorts to the polysilicon gate during contact formation. In the prior art, as illustrated in FIG. 1, voids 20 form in the polysilicon layer at the interface between the polysilicon and the tungsten silicide layers. Voids form after the deposition of the TEOS layer 19 at about 700° C. The high temperature causes some silicon atoms to diffuse out of the polysilicon layer into the silicide layer. This leaves voids 20, having a diameter of between about 0.1 to 0.2 microns.

Figure 2:
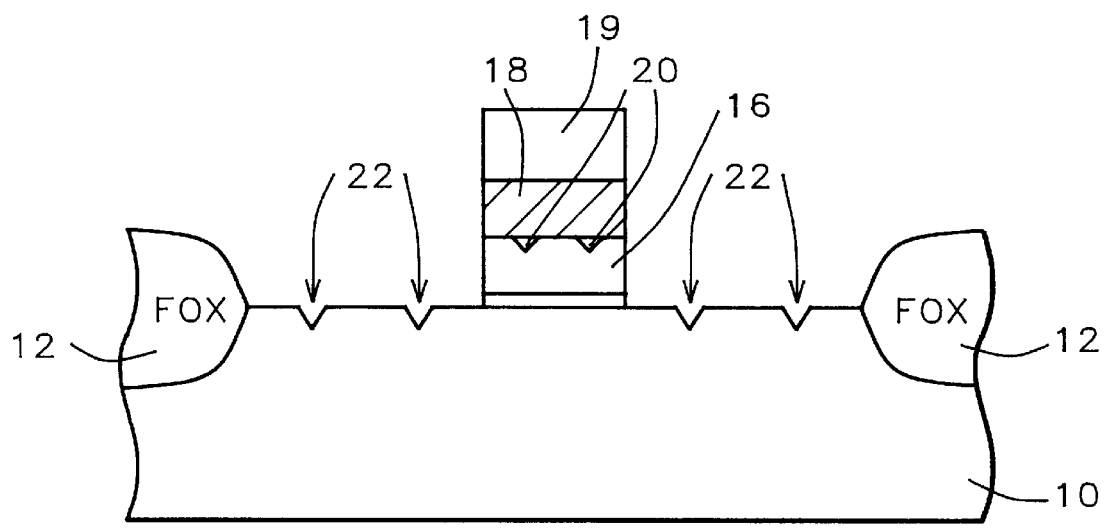

Referring now to FIG. 2 of the prior art, the layers 14, 16, 18, and 19 are etched away where not covered by a mask to form the polycide gate electrode shown in FIG. 2. Because of the voids 20 at the interface between the polysilicon and the tungsten silicide layers, the material will etch faster underlying the voids. Pits 22 are formed in the semiconductor substrate in the active region underlying the voids. The pits may cause junction leakage and low yields. Scanning Electron Microscope (SEM) profiles have shown the presence of these pits in the prior art.

The process of the present invention prevents the formation of silicon pits, as shown in FIG. 2, by eliminating the voids at the silicide/polysilicon interface.

Referring again to FIG. 3, the key feature of the present invention of eliminating voids is described. After the polycide layer 18 is deposited, as shown in FIG. 3, silicon ions 26 are implanted into the tungsten silicide layer at a dosage of between about 1 E 15 to 1 E 16 atoms/cm$^2$ at an energy of between about 100 and 250 KeV. It is possible that implanting other ions would also eliminate voids in the polysilicon layer.

The silicon ions are implanted into the interface between the polysilicon and tungsten silicide layers forming a layer 28. The presence of the silicon ions in the silicide layer balances the silicon concentration profile of the layer so that the silicon atoms will not diffuse into the silicide layer from the polysilicon layer.

Figure 5:
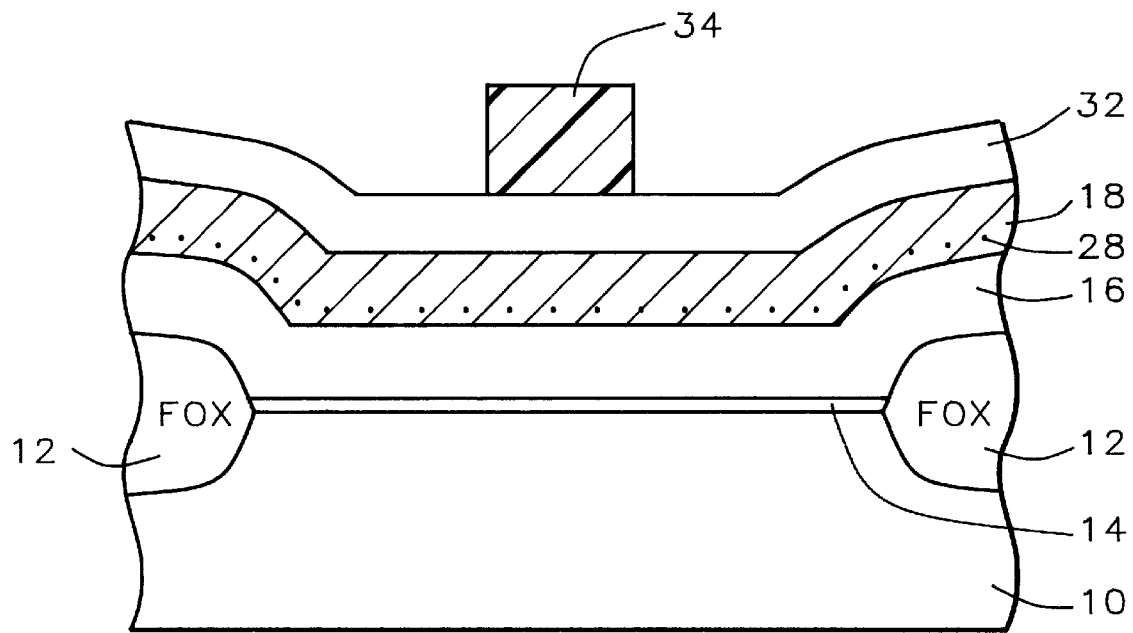

Referring now to FIG. 5, a hard mask 32 is deposited overlying the tungsten silicide layer. For 0.35 $\mu$m and below technology, a hard mask is used to prevent shorts to the polysilicon gate during contact formation. This hard mask may be silicon oxide such as tetraethoxysilane (TEOS) oxide having a thickness of between about 1000 and 2000 Angstroms. A layer of photoresist is coated over the hard mask, exposed, developed, and patterned to form the photoresist mask 34.

Figure 6:
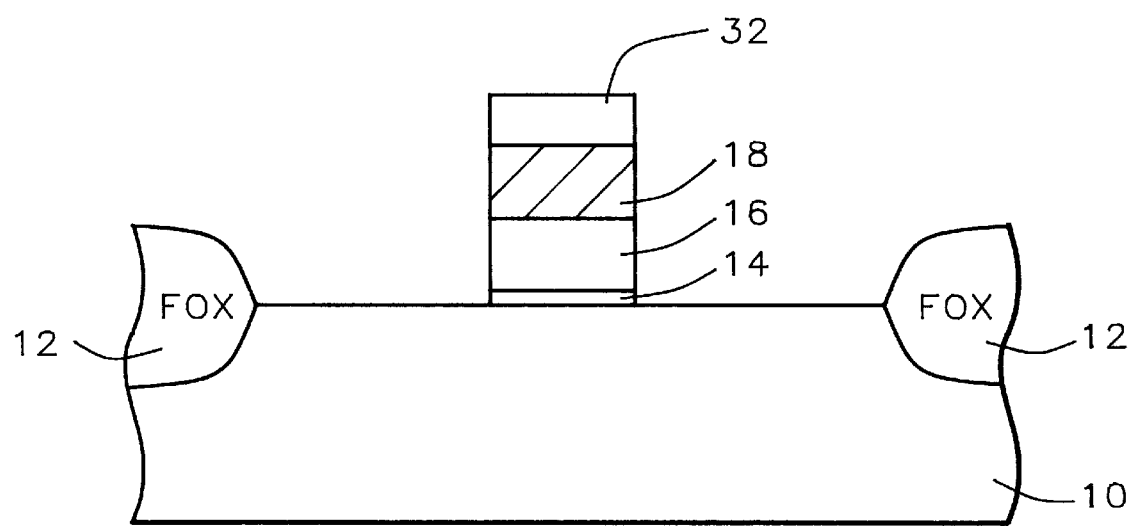

The layers 32, 18, 16, and 14 are etched where they are not covered by the photoresist mask to form the desired gate electrode, as shown in FIG. 6. Because the silicon concentration profile in the silicide layer has been balanced by the ion implantation, silicon atoms do not diffuse out of the polysilicon layer; therefore, no voids are formed in the polysilicon layer. The etching proceeds uniformly, and because there are no voids in the polysilicon layer, no pits are formed in the semiconductor substrate. The process of the present invention has been tried experimentally and has been proven to be effective in eliminating silicon pits in the active areas. Since the silicon ions are implanted before the gate electrode has been etched, no silicon ions are implanted into the semiconductor substrate where the source/drain regions will be formed. The integrity of the source/drain areas is preserved by the process of the invention.

Figure 7:
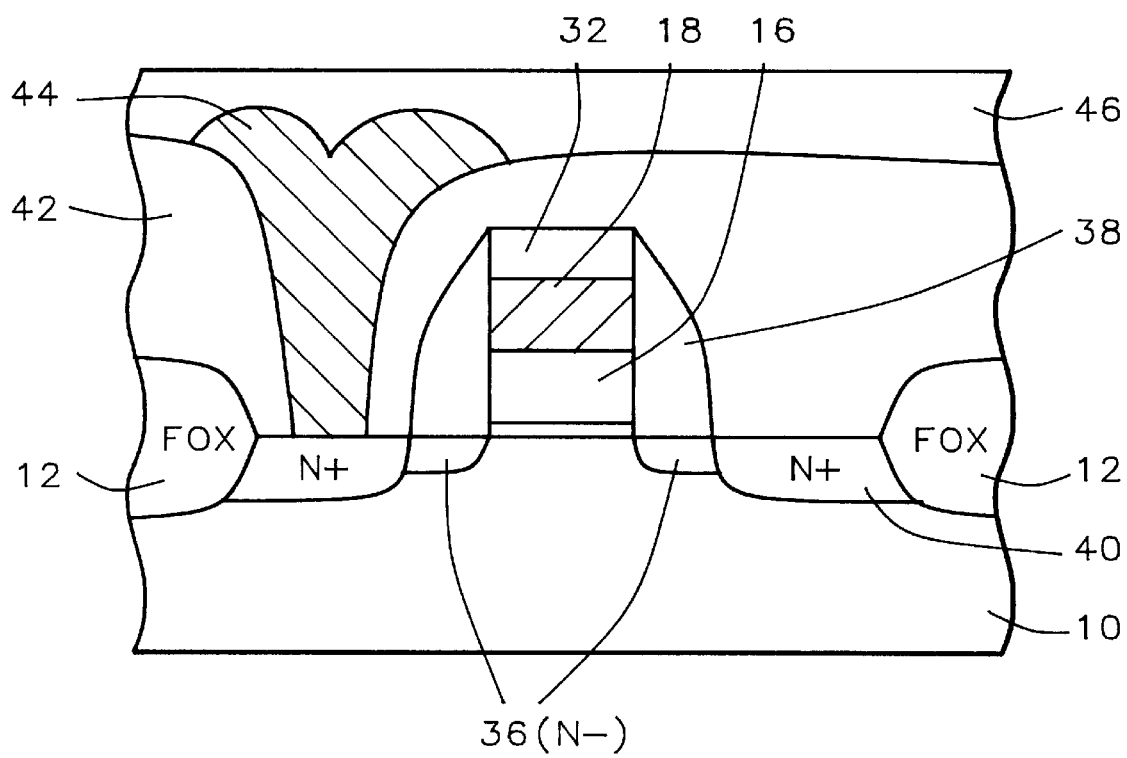

Processing continues as is conventional in the art to form the source/drain structure of the MOSFET. The lightly doped drain (LDD) N− regions 36 are ion implanted. A layer of silicon oxide, such as TEOS oxide, is blanket deposited over the wafer's exposed surfaces and etched to form spacers 38 on the sidewalls of the gate electrode, as illustrated in FIG. 7. The LDD source/drain regions are completed by the ion implantation of N+ ions, such as phosphorus or arsenic to form the heavily doped regions 40.

The integrated circuit device is completed by forming electrical connections between devices. For example, as illustrated in FIG. 7, insulating layer 42 is deposited over the surface of the substrate. Contact openings are made through the insulating layer to the underlying semiconductor devices, such as to a source/drain region 40. A metal layer 44 is deposited and patterned to form electrical connections between the elements of the integrated circuit. A passivation layer 46 completes the fabrication of the integrated circuit device.

The process of the invention provides a simple and effective method of preventing silicon pits in the active areas. Silicon ion implantation into the polysilicon/silicide interface balances the silicon concentration profile there, preventing formation of voids caused by the diffusing of silicon atoms from the polysilicon layer into the silicide layer and thereby preventing the formation of silicon pits during gate etching.

While the invention has been particularly shown and described with reference to the preferred embodiments thereof, it will be understood by those skilled in the art that various changes in form and details may be made without departing from the spirit and scope of the invention.

What is claimed is:

1. A method of fabricating gate electrodes in the manufacture of an integrated circuit device comprising:

growing a layer of gate silicon oxide over the surface of a semiconductor substrate;

depositing a polysilicon layer overlying said gate silicon oxide layer;

forming a silicide layer overlying said polysilicon layer;

implanting ions into said silicide layer;

thereafter depositing a hard mask layer overlying said silicide layer; and patterning said hard mask, said silicide, said polysilicon and said gate silicon oxide layers to complete fabrication of said gate electrodes in the manufacture of said integrated circuit device.

2. The method according to claim 1 wherein said polysilicon layer is deposited by low pressure chemical vapor deposition to a thickness of between about 500 and 1500 Angstroms.

3. The method according to claim 1 wherein said silicide layer has a thickness of between about 1000 and 1500 Angstroms.

4. The method according to claim 1 wherein said silicide layer comprises tungsten silicide.

5. The method according to claim 1 wherein said silicide layer comprises titanium silicide.

6. The method according to claim 1 wherein said step of implanting ions comprises implanting silicon ions with a dosage of between about 1 E 15 to 1 E 16 atoms/cm$^2$ at an energy of between about 100 to 250 KeV.

7. The method according to claim 1 wherein said hard mask layer comprises tetraethoxysilane (TEOS) having a thickness of between about 1000 and 2000 Angstroms.

8. The method according to claim 1 wherein said step of implanting ions into said silicide layer prevents the formation of voids in said polysilicon layer during said step of depositing said hard mask layer and thereby prevents the formation of pits in said semiconductor substrate during said patterning of said suicide and polysilicon layers.

9. A method of fabricating a gate electrode in the manufacture of an integrated circuit device wherein the formation of silicon pits in a semiconductor substrate adjacent to said gate electrode is prevented comprising:

growing a layer of gate silicon oxide over the surface of said semiconductor substrate;

depositing a polysilicon layer overlying said gate silicon oxide layer;

forming a silicide layer overlying said polysilicon layer;

implanting silicon ions into said silicide layer whereby the silicon concentration profile of said silicide layer is balanced;

thereafter depositing a hard mask layer overlying said silicide layer wherein said balanced silicon concentration profile of said silicide layer prevents silicon atoms from diffusing out of said polysilicon layer into said silicide layer and causing voids in said polysilicon layer and wherein the absence of said voids prevents the formation of said silicon pits in said semiconductor substrate; and patterning said hard mask, said silicide, said polysilicon and said gate silicon oxide layers to complete fabrication of said gate electrode in the manufacture of said integrated circuit device.

10. The method according to claim 9 wherein said polysilicon layer is deposited by low pressure chemical vapor deposition to a thickness of between about 500 and 1500 Angstroms.

11. The method according to claim 9 wherein said silicide layer has a thickness of between about 1000 and 1500 Angstroms.

12. The method according to claim 9 wherein said silicide layer comprises tungsten silicide.

13. The method according to claim 9 wherein said silicide layer comprises titanium silicide.

14. The method according to claim 9 wherein said step of implanting silicon ions is performed with a dosage of between about 1 E 15 to 1 E 16 atoms/cm$^2$ at an energy of between about 100 to 250 KeV.

15. The method according to claim 9 wherein said hard mask layer comprises tetraethoxysilane (TEOS) having a thickness of between about 1000 and 2000 Angstroms.

16. A method of fabricating a gate electrode in the manufacture of an integrated circuit device wherein the formation of silicon pits in a semiconductor substrate adjacent to said gate electrode is prevented comprising:

growing a layer of gate silicon oxide over the surface of said semiconductor substrate;

depositing a polysilicon layer overlying said gate silicon oxide layer;

forming a tungsten silicide layer overlying said polysilicon layer;

implanting silicon ions into said tungsten silicide layer whereby the silicon concentration profile of said tungsten silicide layer is balanced;

thereafter depositing a TEOS layer overlying said tungsten silicide layer wherein said balanced silicon concentration profile of said tungsten silicide layer prevents silicon atoms from diffusing out of said polysilicon layer into said tungsten silicide layer and causing voids in said polysilicon layer and wherein the absence of said voids prevents the formation of said silicon pits in said semiconductor substrate; and patterning said TEOS, said tungsten silicide, said polysilicon and said gate silicon oxide layers to complete fabrication of said gate electrode in the manufacture of said integrated circuit device.

17. The method according to claim 16 wherein said polysilicon layer is deposited by low pressure chemical vapor deposition to a thickness of between about 500 and 1500 Angstroms.

18. The method according to claim 16 wherein said tungsten silicide layer has a thickness of between about 1000 and 1500 Angstroms.

19. The method according to claim 16 wherein said step of planting silicon ions is performed with a dosage of between about 1 E 15 to 1 E 16 atoms/cm$^2$ at an energy of between about 100 to 250 KeV.

20. The method according to claim 16 wherein said TEOS layer has a thickness of between about 1000 and 2000 Angstroms.

* * * * *